(12) United States Patent
Kim et al.

(10) Patent No.: US 6,509,244 B2
(45) Date of Patent: Jan. 21, 2003

(54) METHOD FOR FORMING STORAGE NODE ELECTRODE USING A POLYSILICON HARD MASK ON A SACRIFICIAL INSULATION FILM

(75) Inventors: Chang-Il Kim, Seoul (KR); Chen-kwon Oh, Gyunggi-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 09/888,908

(22) Filed: Jun. 25, 2001

(65) Prior Publication Data

US 2002/0102807 A1 Aug. 1, 2002

(30) Foreign Application Priority Data

Jun. 30, 2000 (KR) ............................................. 00-37262

(51) Int. Cl.[7] ......................................... H01L 21/8242
(52) U.S. Cl. ...................................... 438/386; 438/243
(58) Field of Search ................................. 438/386, 239, 438/387, 243, 244

(56) References Cited

U.S. PATENT DOCUMENTS 5,136,533 A   8/1992  Harari
5,399,890 A   3/1995  Okada et al.

*Primary Examiner*—Vu A. Le
*Assistant Examiner*—Beth E. Owens
(74) *Attorney, Agent, or Firm*—Marshall, Gerstein & Borun

(57) ABSTRACT

A method for forming a storage node electrode of a semiconductor device, includes the steps of: forming a contact plug in an interlayer insulation film on a semiconductor substrate; sequentially stacking etch stop films, a sacrificial insulation film, a polysilicon hard mask and a reflection preventative film on the surface of the interlayer insulation film; forming an opening by etching the hard mask, the sacrificial insulation film and the etch stop films to remove the reflection preventative film to obtain a storage node electrode region; forming a storage node electrode by depositing a conductive material over the resultant structure; forming a filling film for filling up the opening; etching the filling film, the storage node electrode and the hard mask so that the hard mask has a predetermined thickness; and etching the resultant structure with a chemical mechanical polishing process so that the residual hard mask can be completely removed. Thus, the sacrificial insulation film is not excessively etched, thereby preventing an etch step of the sacrificial insulation film between a peripheral region and a cell region, and also obtaining a sufficient capacity of the storage node electrode.

4 Claims, 9 Drawing Sheets

METHOD FOR FORMING STORAGE NODE ELECTRODE USING A POLYSILICON HARD MASK ON A SACRIFICIAL INSULATION FILM

BACKGROUND

1. Technical Field

A method for fabricating a semiconductor device, and in particular to an improved method for forming a storage node electrode of a high integration semiconductor device is disclosed.

2. Description of the Background Art

Recently, reductions in cell surface area and operation voltage have been actively investigated in order to achieve a highly integrated semiconductor device. In a highly integrated semiconductor device, the area of a capacitor is sharply reduced. Therefore, it is required to increase charges for the operation of the memory device, namely capacitance per unit area.

On the other hand, the capacitor for a memory cell basically consists of a storage node electrode, a dielectric film and a plate node electrode. A useful capacitor for obtaining high capacitance in a small area has a desired characteristic: a dielectric film that is thin, with an effective area is increased by the three-dimensional structure of the capacitor, or the dielectric film is composed of a material having a high dielectric constant.

In general, when a leakage current is decreased and a breakdown voltage is increased, the capacitor obtains a good dielectric film. However, when the dielectric film has a thickness of less than 100 Å, the leakage current is increased due to a phenomenon known as Fowler-Nordheim tunneling, thereby reducing reliability. In addition, a method for using the material having the high dielectric constant in the memory cell capacitor has been investigated, so that high capacitance can be obtained. even in the small area of the high integration memory device. At last, a method for increasing an area of the storage node electrode through the three-dimensional structure has been suggested to increase the effective area of the capacitor.

A semiconductor device such as 256M DRAM has normally employed an inner cylinder type storage node electrode. A conventional method for forming the inner cylinder type storage node electrode will now be described with reference to the accompanying drawings.

FIGS. 1a to 1d illustrate sequential steps of the conventional method for forming the storage node electrode of the semiconductor device.

One preferred example of the conventional method uses a polysilicon hard mask. Referring to FIG. 1a, a contact plug 14 is formed in an interlayer insulation film 12 of a semiconductor substrate 10 where a predetermined device structure has been formed. Thereafter, etch stop films 16, 18, a sacrificed insulation film 20, a polysilicon hard mask 22 and a reflection stop film 24 are sequentially stacked on the whole surface of the interlayer insulation film 12 where the contact hole 14 has been formed. Here, reference numeral 16 denotes a nitride film which serves as the etch stop film of the sacrificed insulation film 20, and reference numeral 18 denotes a high density plasma (HDP) film which serves as the etch stop film and dip-out of the sacrificed insulation film 20.

As illustrated in FIG. 1b, in order to provide a region for the storage node electrode, an opening 26 is formed by etching the hard mask 22', the sacrificial insulation film 20' and the etch stop film 18'. According to the etching process, the reflection stop film 24 is removed, and the polysilicon hard mask 22' is partially etched. The etch stop film 16 remains unaltered.

Referring to FIG. 1c, if etching the hard mask 22' remains on the resultant structure where the opening 26 has been formed, the sacrificial insulation film 20' is partially damaged. Thereafter, when the etch stop film 16' is patterned to expose the surface of the contact plug, the sacrificial insulation film 20' is damaged again. The loss of the sacrificial insulation film 20' influences the height of the inner cylinder type storage node electrode. Therefore, when the hard mask film 22' and the etch stop films 16', 18' are removed, the loss of the sacrificial insulation film 20' must be minimized.

As depicted in FIG. 1d, a conductive material is deposited on the opening 26, thereby forming the inner cylinder type storage node electrode 28. A filling film (not shown) is formed to fill up the opening part 26, and its surface is polished. Thereafter, the sacrificial insulation film 20' is removed, and a dielectric film 30 and a plate node electrode 32 are sequentially formed on the storage node electrode 28. Thus, fabrication of the capacitor is finished.

As described above, when the hard mask film and the etch stop film are removed, the inner cylinder type storage node electrode 28 is excessively damaged. As a result, the area of the storage node electrode is decreased, and thus capacity of the capacitor is also reduced.

FIGS. 2a and 2b illustrate sequential steps of another conventional method for forming a storage node electrode of a semiconductor device, which has been thought to reduce the loss of the sacrificed insulation film.

As illustrated in FIG. 2a, the hard mask film 22, the sacrificial insulation film 20' and the etch stop films 18', 16' which are stacked as in the above-described method are etched to form the opening.

Thereafter, the inner cylinder type storage node electrode 28 is formed by depositing the conductive material on the resultant structure. The filling film 29 is formed to fill up the opening part. Then, the whole surface is polished according to a chemical mechanical polishing process.

As shown in FIG. 2b, the polishing process is performed until the hard mask 22' is removed. At this time, a cell region 100 has higher density than a peripheral region 200, and thus a polishing speed of the cell region is increased. As a result, a T-shaped step is formed between the peripheral region 200 and the cell region 100.

Therefore, the capacity of the capacitor is much smaller in the cell region than the peripheral region. Accordingly, the method using the chemical mechanical polishing process increases the step between the peripheral region and the cell region, and reduces the capacity of the capacitor in the cell region, thereby deteriorating the property of the device.

SUMMARY OF THE DISCLOSURE

A storage node electrode of a semiconductor device is disclosed, which prevents an etch step of a sacrificial insulation film between a peripheral region and a cell region, and which minimizes an etch loss of the sacrificial insulation film. The disclosed method involves forming an opening part for the inner cylinder type storage node electrode, forming the storage node electrode and a filling film for filling up the opening, etching the resultant structure until a polysilicon hard mask reaches a predetermined thickness, and removing the hard mask according to a chemical mechanical polishing process.

A disclosed method for forming a storage node electrode of a semiconductor device comprises: forming a contact plug in an interlayer insulation film on a semiconductor substrate where a predetermined device structure has been formed; sequentially stacking at least one etch stop film, a sacrificial insulation film, a polysilicon hard mask and a reflection stop film on the whole surface of the interlayer insulation film where the contact plug has been formed; forming an opening in the hard mask, the sacrificial insulation film and the etch stop films to remove the reflection stop film to obtain a storage node electrode region; forming a storage node electrode by depositing a conductive material over the resultant structure where the opening has been formed; forming a filling film for filling up the opening; etching the filling film, the storage node electrode and the hard mask so that the hard mask has a predetermined thickness; and etching the resultant structure according to a chemical mechanical polishing process so that the residual hard mask can be completely removed.

The method for forming the storage node electrode of the semiconductor device may further include forming etch preventive films, before forming the storage node electrode by depositing the conductive material over the resultant structure where the opening part has been formed.

The etching of the resultant structure so that the hard mask has a predetermined thickness may be performed by using fluorine or chlorine etching solution so that the hard mask becomes a residual target below 500Å.

The etching of the resultant structure according to the chemical mechanical polishing process so that the residual hard mask can be completely removed is performed by using an abrasive of 50 to 300 nm and maintaining pH ranging from about 6 to about 11.

BRIEF DESCRIPTION OF THE DRAWINGS

The disclosed method will become better understood with reference to the accompanying drawings which are given only by way of illustration and thus are not limitative of the disclosed method, wherein.

DETAILED DESCRIPTION OF THE PRESENTLY PREFERRED EMBODIMENTS

A method for forming a storage node electrode of a semiconductor device in accordance with a preferred embodiment will now be described in detail with reference to the accompanying drawings.

Figure 1A:
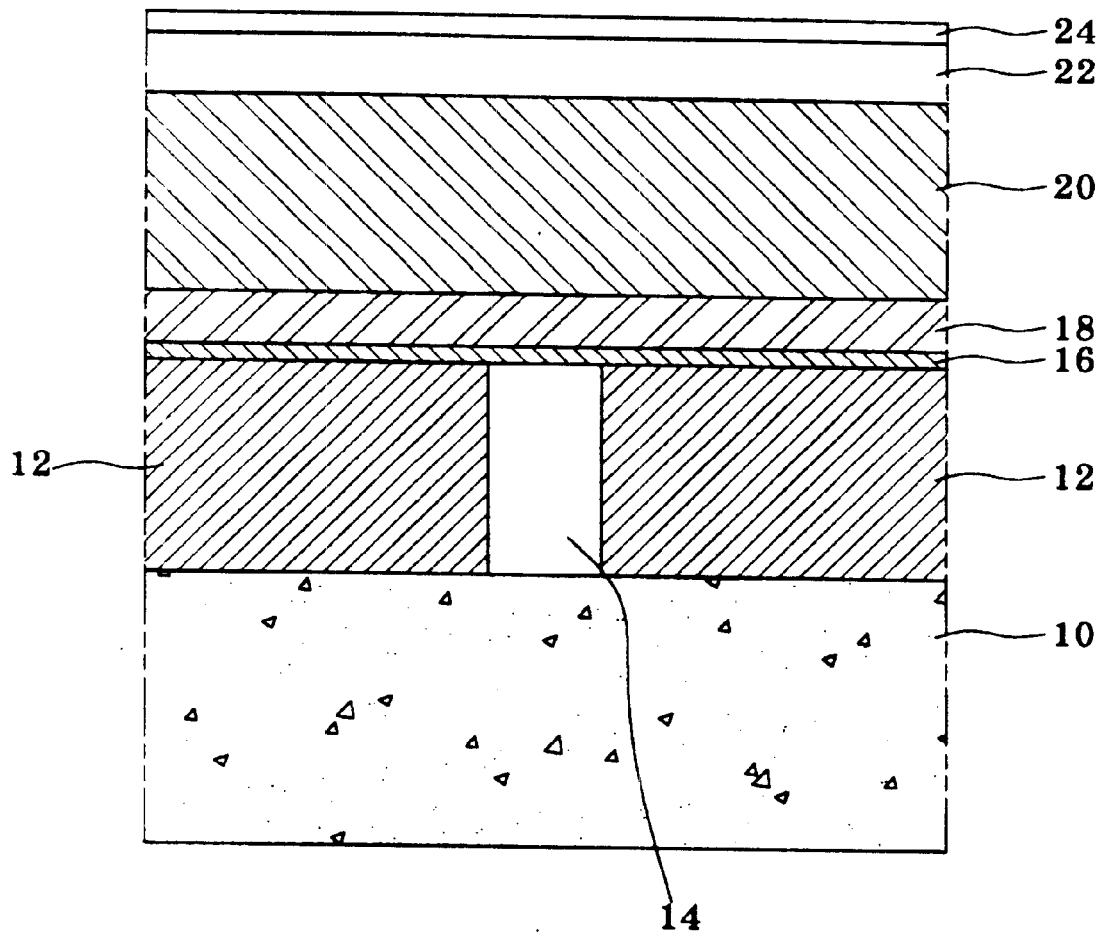
FIGS. 1a to 1d illustrate sequential steps of a conventional method for forming a storage node electrode of a semiconductor device.
Figure 1B:
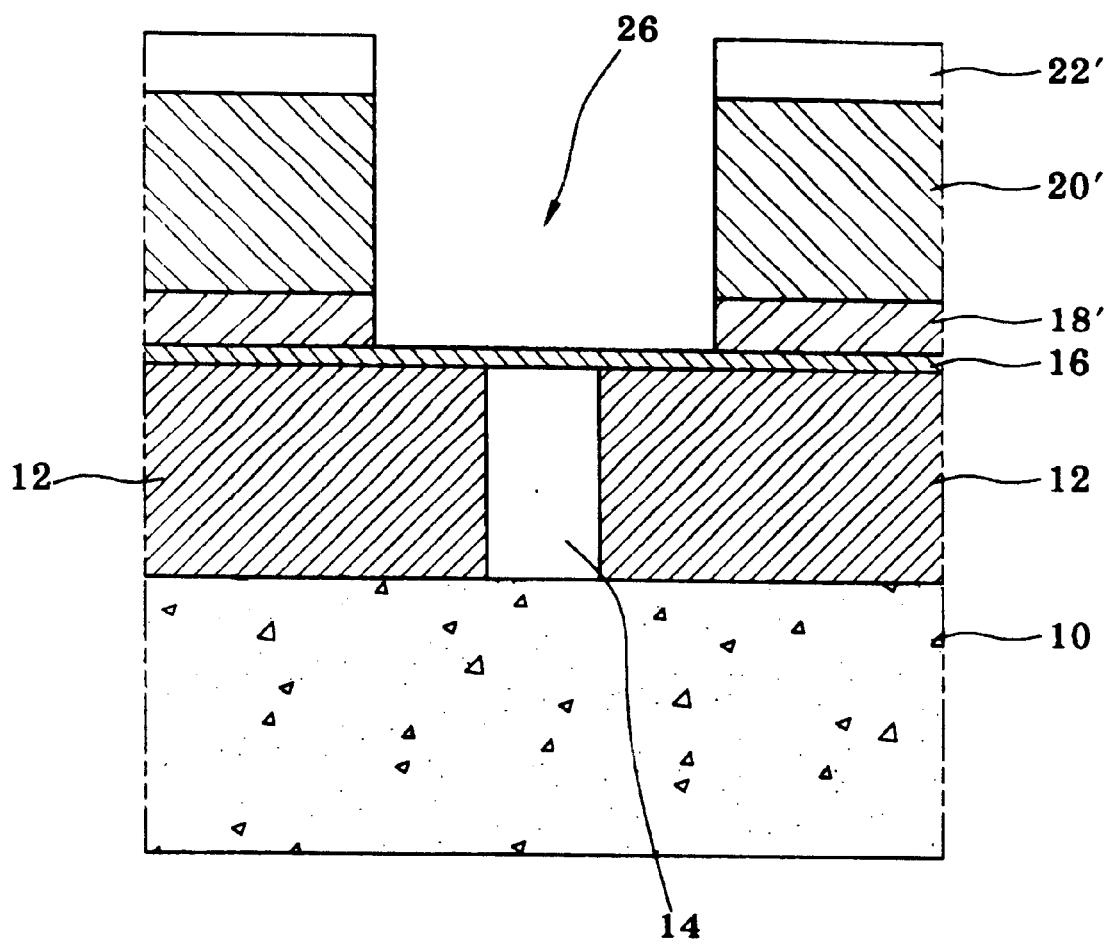
Figure 1C:
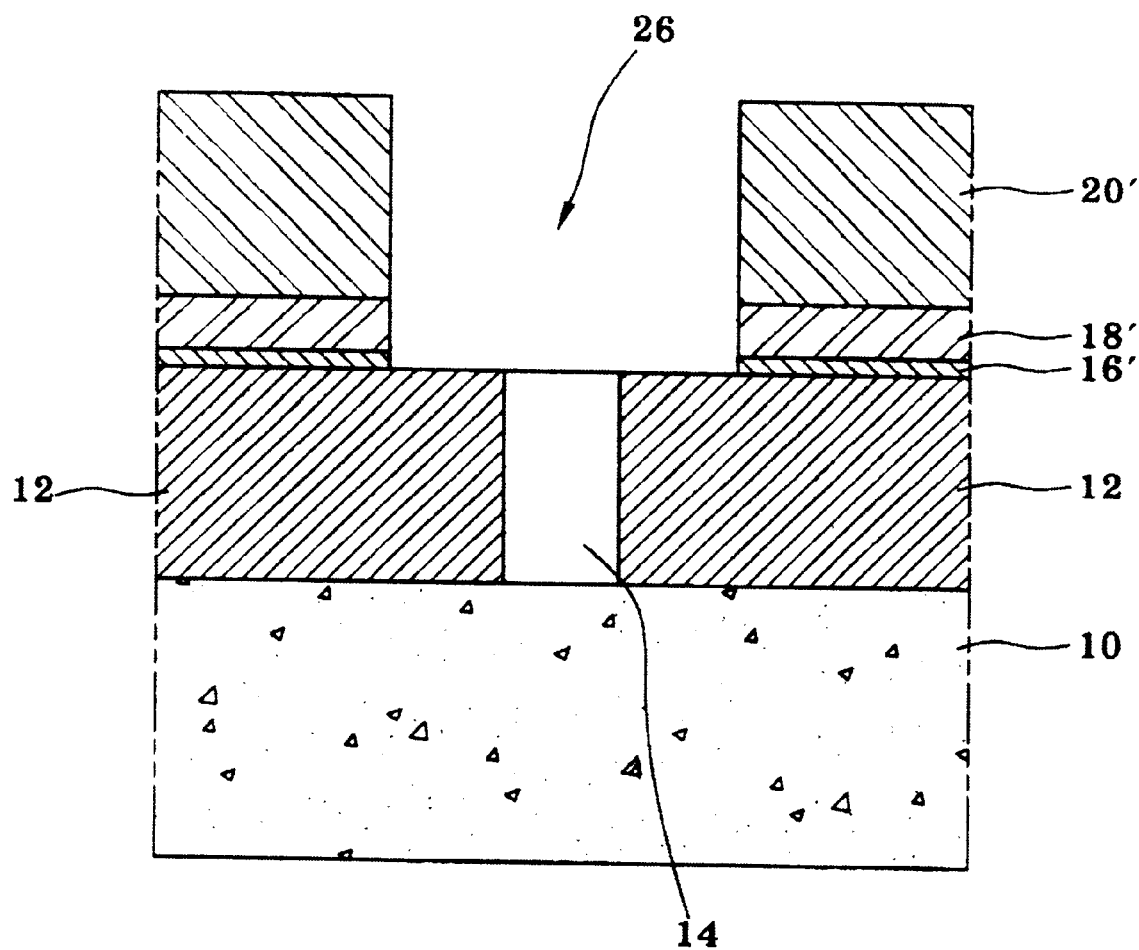
Figure 1D:
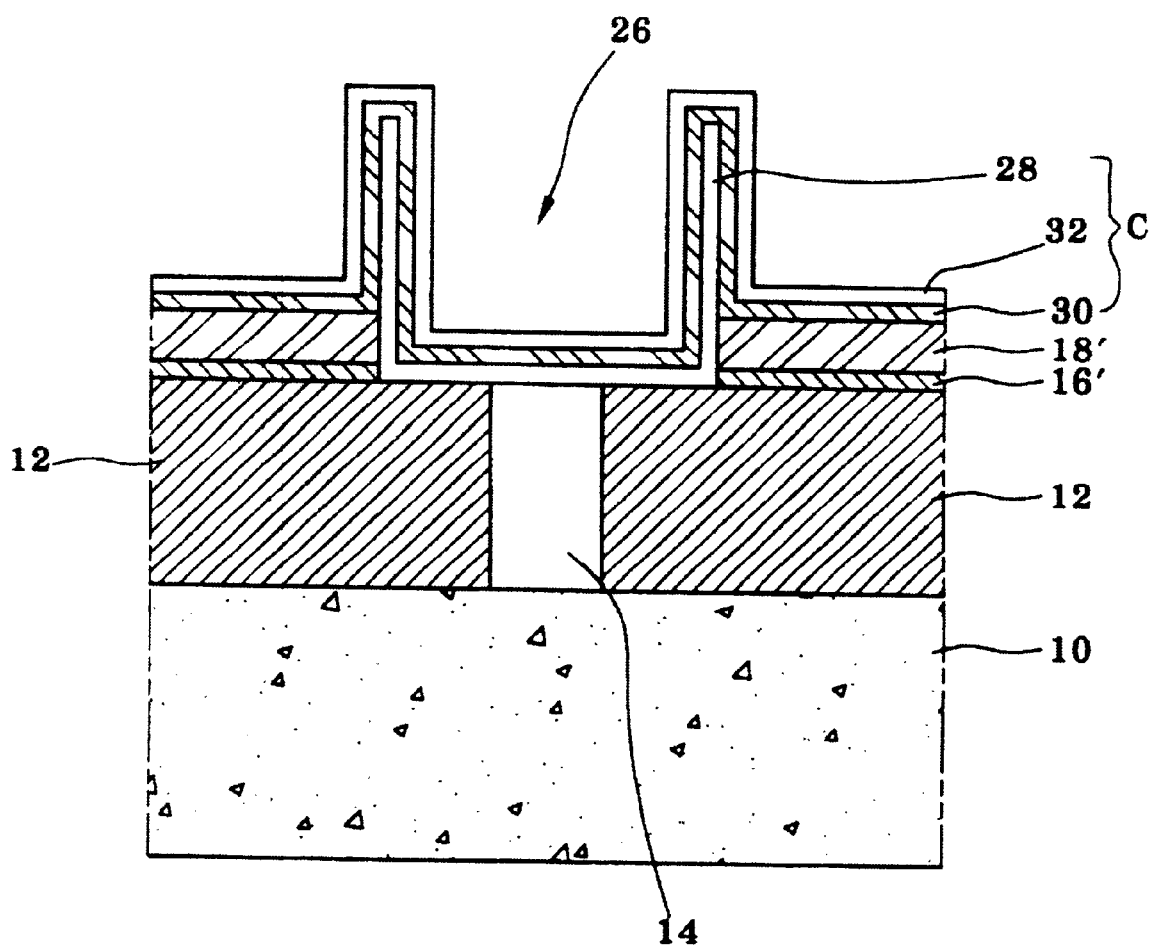
Figure 2A:
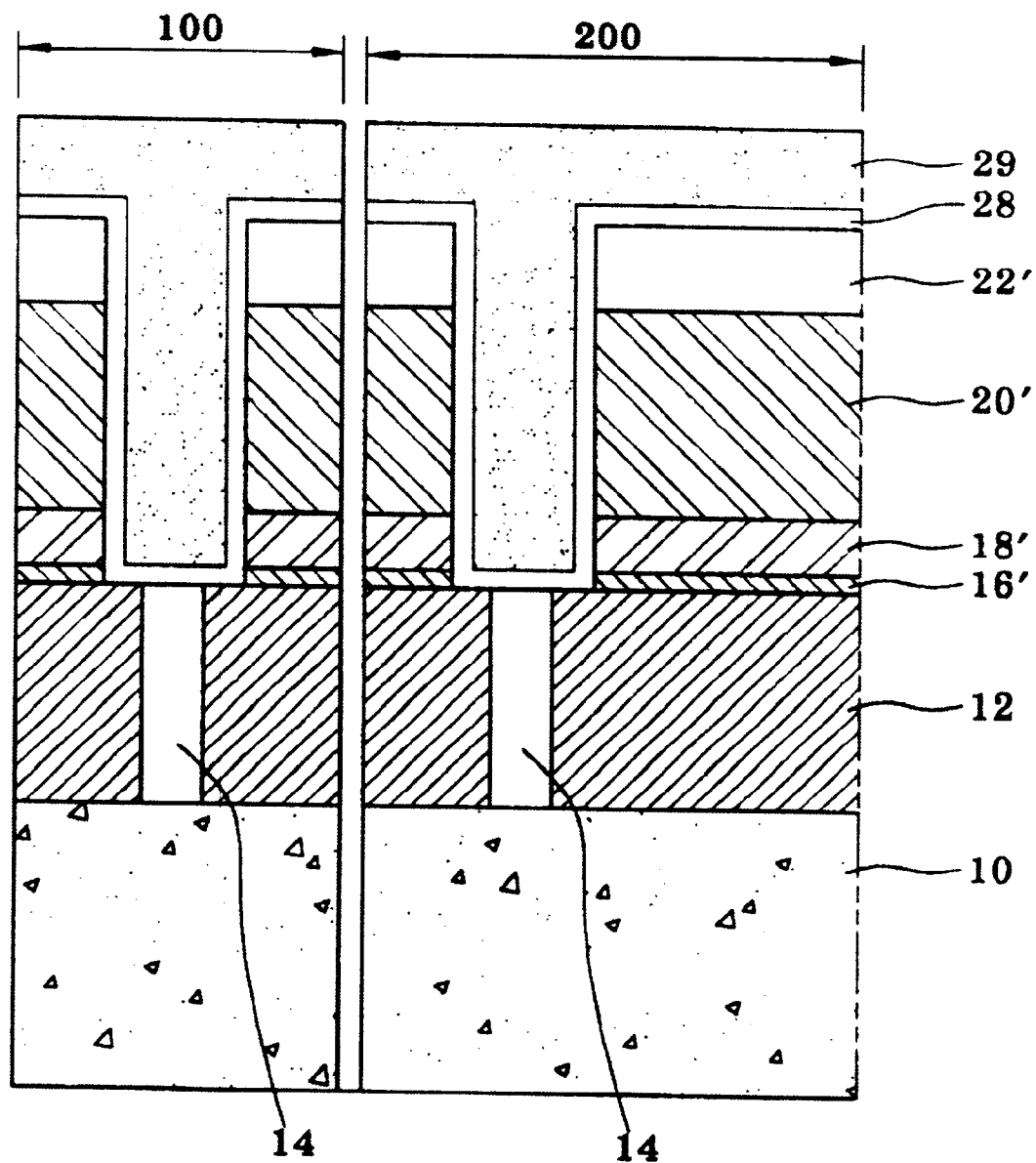
FIGS. 2a and 2b illustrate sequential steps of another conventional method for forming a storage node electrode of a semiconductor device.
Figure 2B:
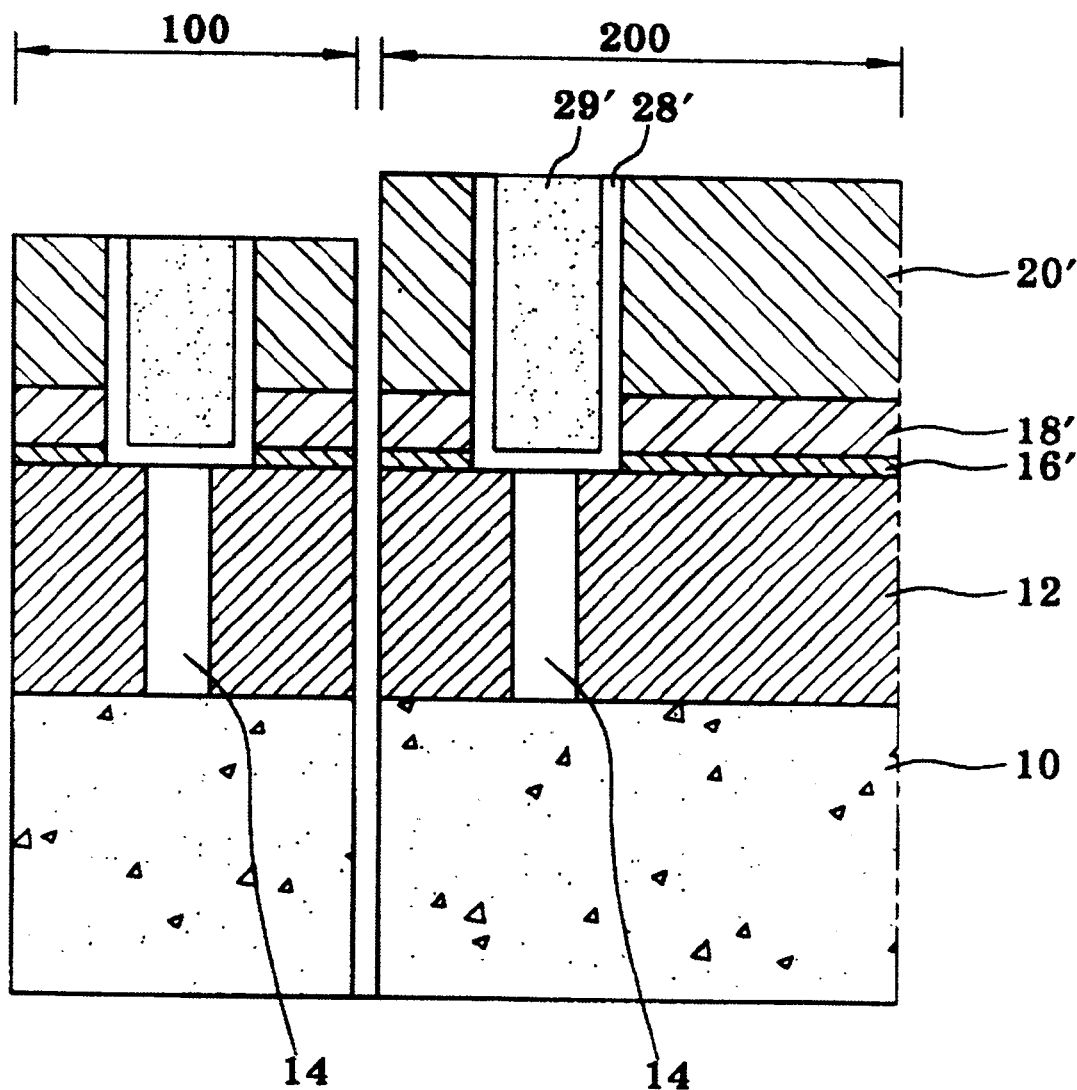
Figure 3A:
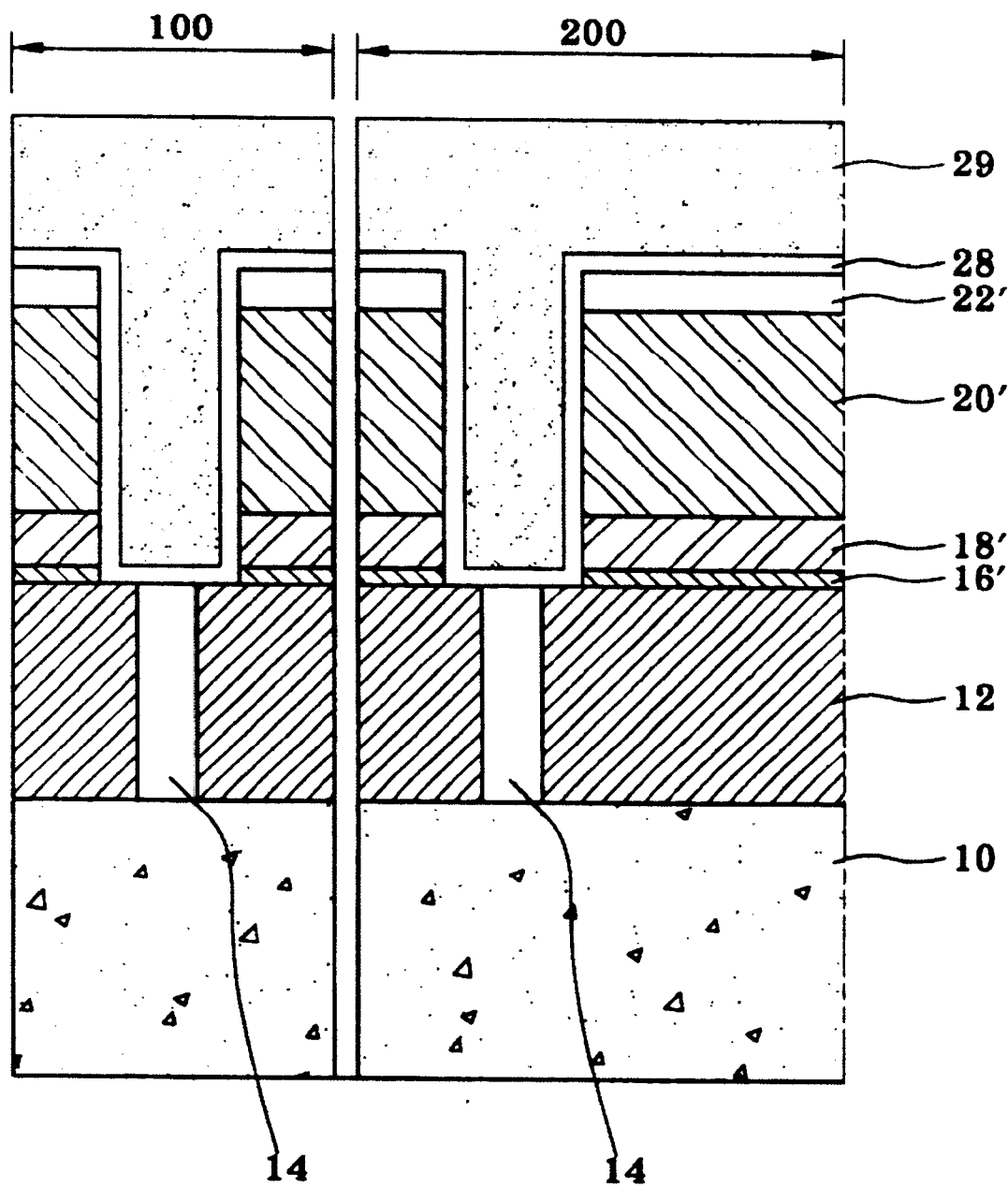
FIGS. 3a to 3c illustrate sequential steps of a disclosed method for forming a storage node electrode of a disclosed semiconductor device.
Figure 3B:
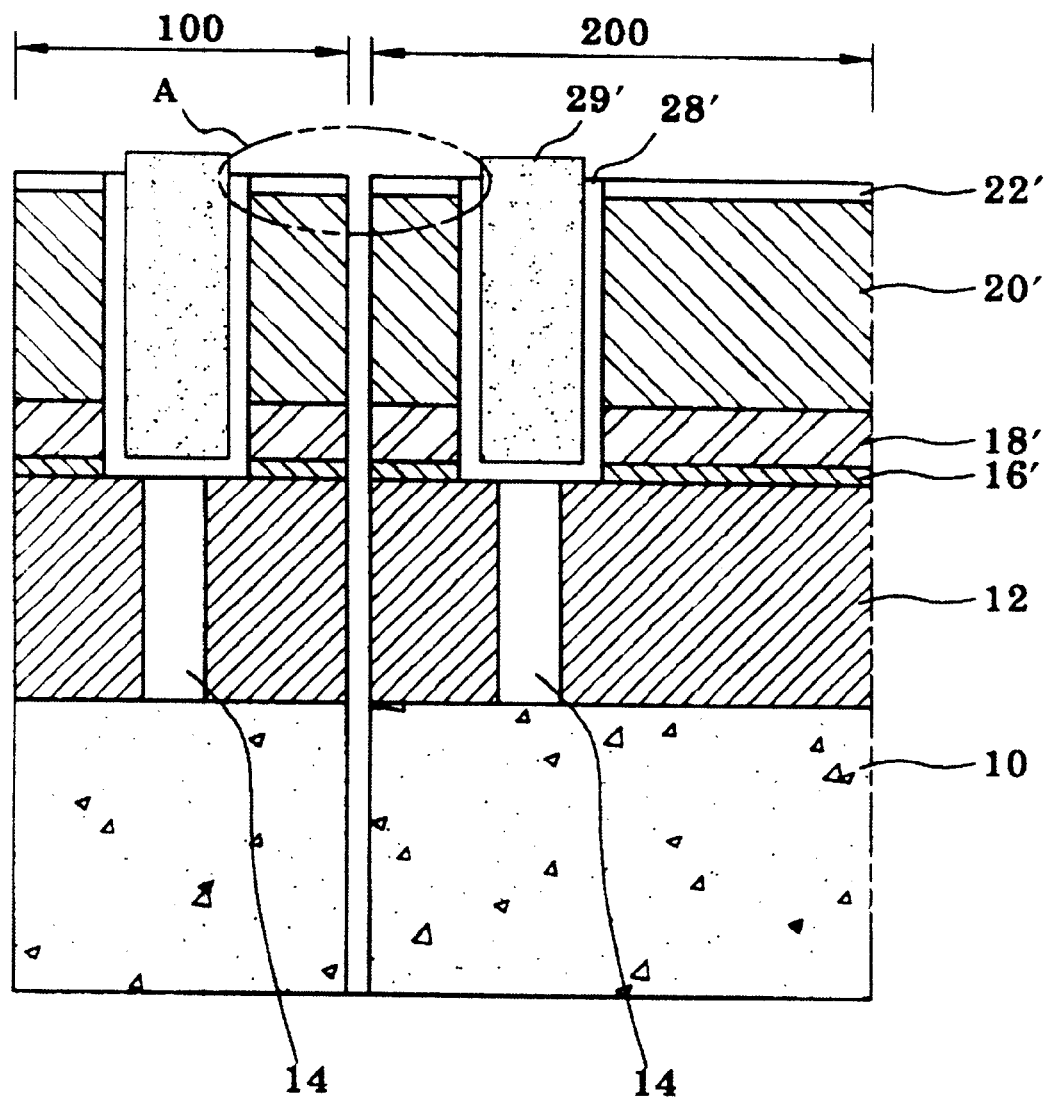
Figure 3C:
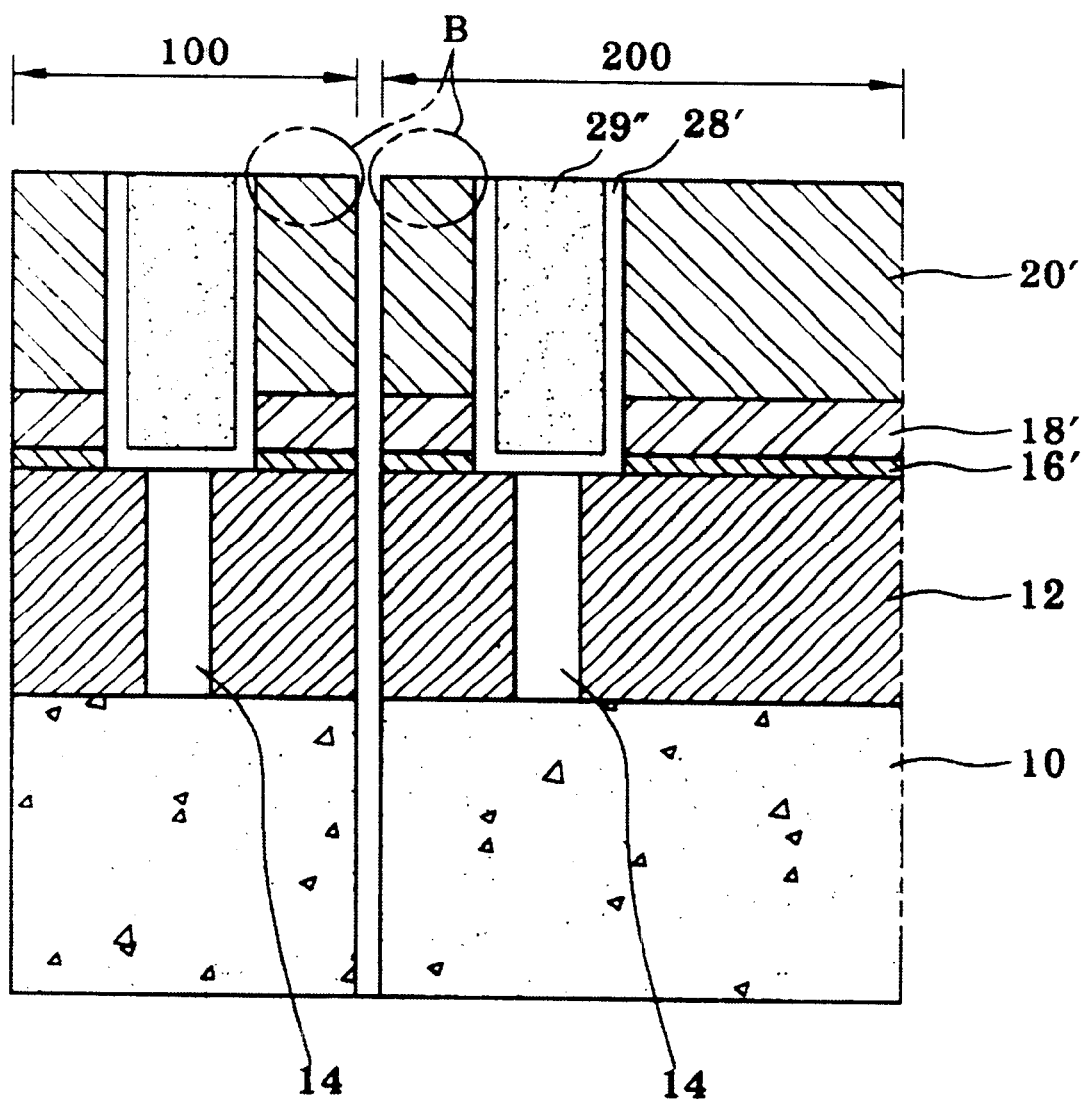

FIGS. 3a to 3c illustrate sequential steps of the method for forming the storage node electrode of the disclosed semiconductor device. Here, identical components to the conventional method are provided with identical reference numerals.

Although not illustrated in the drawings, a transistor is formed on a silicon substrate according to a series of processes, a contact electrode connected to a junction region of the transistor is formed in an interlayer insulation film, and a bit line is formed on the interlayer insulation film according to a general interconnection process.

A contact plug 14 connected to the lower substrate is formed in the interlayer insulation film 12 of the semiconductor substrate 10 where the bit line has been formed. Thereafter, etch stop films 16', 18', a sacrificial insulation film 20', a polysilicon hard mask 22' and a reflection preventative film 24 (not shown) are sequentially stacked on the whole surface of the interlayer insulation film 12. Here, reference numeral 16' denotes a nitride film which serves as the etch stop film of the sacrificial insulation film 20', and reference numeral 18' denotes a high density plasma (HDP) film which serves as the etch stop film in dip-out of the sacrificial insulation film 20'. Thereafter, the inner cylinder type storage node electrode 28 is formed by depositing the conductive material on the resultant structure. The filling film 29 is formed to fill up the opening part. Then, the whole surface is polished according to a chemical mechanical polishing process.

Thereafter, the hard mask 22' is etched to obtain a region of the storage node electrode, and the sacrificial insulation film 20' and the etch stop films 18', 16' are etched according to the hard mask pattern 22', thereby forming an opening. At this time, the reflection preventative film 24 (not shown) is completely removed according to the etching process.

As illustrated in FIG. 3b, the hard mask 22' is not removed at this time. That is, the filling film 29', the storage node electrode 28' and the hard mask 22' are etched by using a slurry for an oxide film, so that the hard mask 22' on the sacrificial insulation film 20' has a predetermined thickness and there is no difference in height between the cell region 100 and peripheral region 200 as shown in the area referenced as "A." Here, a residual target thickness of the hard mask 22' is below 500 Å, by using fluorine etching solution such as $CF_4$ and $SF_6$ or chlorine etching solution such as $Cl_2$ and $CCl_4$.

Referring to FIG. 3c, the resultant structure is etched according to a chemical mechanical polishing process so that the residual hard mask 22' can be completely removed. Here, the chemical mechanical polishing process is performed by using an abrasive of 50 to 300 nm and maintaining a pH from about 6 to about 11. Accordingly, the storage node electrode 28' and the filling film 29' are polished by the residual hard mask 22' until the surface of the sacrificial insulation film 20' is homogeneously exposed in a cell region 100 and a peripheral region 200 as shown in the area referenced "B." As a result, it is possible to remove an etch step of the sacrificial insulation film 20 due to density difference between the cell region 100 and the peripheral region 200, and to obtain a sufficient capacity of the storage node electrode.

Thereafter, although not illustrated, a dielectric material and a plate node electrode are sequentially formed on the planarized surface of the resultant structure, and thus fabrication of the capacitor is finished.

As discussed earlier, in the process for fabricating the capacitor by using the polysilicon hard mask, the opening for the inner cylinder type storage node electrode is formed, the storage node electrode and the filling film for filling up the opening are formed, the resultant structure is etched until the hard mask reaches a predetermined thickness, and the hard mask is completely removed according to the chemical mechanical polishing process. Accordingly, the sacrificial insulation film is not excessively etched, thus preventing the etch step of the sacrificial insulation film between the peripheral region and the cell region, and also preventing a loss of the storage node electrode. It is thus not required to increase the thickness of the sacrificial insulation film.

As a result, performance of the device and reliability of the fabrication process are remarkably improved by preventing reduction of the capacity of the capacitor in the high integration semiconductor device.

What is claimed is:

1. A method for forming a storage node electrode of a semiconductor device, comprising the steps of:

forming a contact plug in an interlayer insulation film on a semiconductor substrate where a predetermined device structure has been formed;

sequentially stacking at least one etch stop film, a sacrificial insulation film, a polysilicon hard mask and a reflection preventative film on the surface of the interlayer insulation film where the contact plug has been formed;

removing the reflection preventative film while forming an opening by etching the hard mask, the sacrificial insulation film and the at least one etch stop films to obtain a storage node electrode region;

forming a storage node electrode by depositing a conductive material over the hard mask and formed opening;

forming a filling film for filling up the opening to provide a resultant structure;

etching the resultant structure so that the hard mask has a predetermined thickness; and subsequently performing a chemical-mechanical polishing process to completely remove the hard mask.

2. The method of claim 1, further comprising forming a plurality of etch stop films before forming the storage node electrode.

3. The method of claim 1, wherein the step of etching the resultant structure is carried out with a fluorine or chlorine solution and the predetermined thickness of the hard mask is less than 500 Å.

4. The method according to claim 1, wherein the chemical-mechanical polishing process used to completely remove the hard mask is performed by using an abrasive of a size ranging from about 50 to about 300 nm and at a pH ranging from about 6 to about 11.

* * * * *